US008603590B2

(12) United States Patent
Laude et al.

(10) Patent No.: US 8,603,590 B2
(45) Date of Patent: *Dec. 10, 2013

(54) POLYMER LAYER COMPRISING SILICONE AND AT LEAST ONE METAL TRACE AND A PROCESS OF MANUFACTURING THE SAME

(75) Inventors: Lucien D. Laude, Rabastens-de-Bigorre (FR); Neil Hamilton Talbot, Montrose, CA (US); Robert J. Greenberg, Los Angeles, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 1004 days.

This patent is subject to a terminal disclaimer.

(21) Appl. No.: 11/924,363

(22) Filed: Oct. 25, 2007

(65) Prior Publication Data

US 2008/0085376 A1 Apr. 10, 2008

Related U.S. Application Data

(62) Division of application No. 11/595,516, filed on Nov. 10, 2006, now Pat. No. 7,750,076.

(60) Provisional application No. 60/811,683, filed on Jun. 7, 2006.

(51) Int. Cl.
*B05D 3/06* (2006.01)
*B05D 5/04* (2006.01)
*B05D 5/12* (2006.01)
*C08J 7/06* (2006.01)
*C08J 7/12* (2006.01)

(52) U.S. Cl.
USPC ............. 427/555; 427/558; 427/581; 216/94; 219/121.69; 219/121.71

(58) Field of Classification Search
None
See application file for complete search history.

(56) References Cited

U.S. PATENT DOCUMENTS 4,826,583 A * 5/1989 Biernaux et al. .......... 204/224 R
4,865,873 A * 9/1989 Cole, Jr. et al. ................ 427/555

(Continued)

FOREIGN PATENT DOCUMENTS

EP 0 442 674 A2 8/1991
EP 1 371 754 A1 12/2003

(Continued)

OTHER PUBLICATIONS

Vince, V., et al., Biocompatibility of Platinum-Metalized Silicone Rubber; in Vivo and in Vitro Evaluation; J. Biomater. Sci. Polymer Edn. 2004, pp. 173-188, vol. 15, No. 2.

(Continued)

*Primary Examiner* — Marianne L Padgett
(74) *Attorney, Agent, or Firm* — Scott B. Dunbar; Gary Schnittgrund

(57) ABSTRACT

The invention relates to a method of embedding a metal trace in a silicone containing polymer layer, by the steps of applying an agent that does not adhere to a substrate; applying a polymer layer on the non adhering agent; irradiating a surface of the polymer with a light beam emitted by an excimer laser creating cuts, grooves, blind holes or vias; immersing the irradiated polymer in an autocatalytic bath containing metal ions and metallizing the polymer; thermally treating the metallized polymer layer to induce diffusion of the metalized metal into the first polymer layer; applying a polymer layer on the thermally treated metallized polymer; and thermally treating the metallized polymer.

8 Claims, 12 Drawing Sheets

(56) References Cited

U.S. PATENT DOCUMENTS

| | | | |
|---|---|---|---|
| 5,096,626 A * | 3/1992 | Takamizawa et al. | 264/1.7 |
| 5,109,844 A | 5/1992 | de Juan, Jr. et al. | |
| 5,215,801 A * | 6/1993 | Wong | 428/76 |
| 5,314,709 A * | 5/1994 | Doany et al. | 427/555 |
| 5,599,592 A | 2/1997 | Laude | |
| 5,750,956 A * | 5/1998 | Barnes et al. | 219/121.71 |
| 5,935,155 A | 8/1999 | Humayun et al. | |
| 6,400,989 B1 | 6/2002 | Eckmiller | |
| 6,458,157 B1 | 10/2002 | Suaning | |
| 6,596,569 B1 | 7/2003 | Bao et al. | |
| 6,743,345 B2 | 6/2004 | Belouet et al. | |
| 6,878,643 B2 | 4/2005 | Krulevitch et al. | |
| 7,033,648 B1 * | 4/2006 | Doany et al. | 427/537 |
| 2004/0018297 A1 * | 1/2004 | Davidson et al. | 427/58 |
| 2004/0121528 A1 * | 6/2004 | Krulevitch et al. | 438/166 |
| 2005/0233154 A1 * | 10/2005 | Miner et al. | 428/425.9 |
| 2008/0069971 A1 * | 3/2008 | Keersmaecker et al. | 427/555 |
| 2009/0308742 A1 * | 12/2009 | Paranjape | 204/403.1 |
| 2010/0068538 A1 * | 3/2010 | Fisher | 428/447 |
| 2010/0323297 A1 * | 12/2010 | Yanagisawa | 430/315 |
| 2011/0003086 A1 * | 1/2011 | Chung et al. | 427/555 |

FOREIGN PATENT DOCUMENTS

| | | | |
|---|---|---|---|
| JP | 62-174117 A * | 1/1986 | B29C 39/02 |
| WO | WO 97/33307 | 9/1997 | |

OTHER PUBLICATIONS

Laude, L.D., et al., Laser Metallization for Microelectronics and Bio-Applications, Photon Processing in Microelectronics and Photonics 11, 2003, pp. 578-586, SPIE, vol. 4977.

* cited by examiner

POLYMER LAYER COMPRISING SILICONE AND AT LEAST ONE METAL TRACE AND A PROCESS OF MANUFACTURING THE SAME

CROSS-REFERENCE TO RELATED APPLICATIONS

This application is a divisional of application Ser. No. 11/595,516, entitled "Polymer Comprising Silicone and at Least One Metal Trace", filed Nov. 10, 2006, now issued as U.S. Pat. No. 7,750,076 on Jul. 6, 2010, which claims the benefit of U.S. Provisional Application No. 60/811,683, "Polymer Layer Comprising Silicone and at Least One Metal Trace and a Process of Manufacturing the Same," filed Jun. 7, 2006.

BACKGROUND OF THE INVENTION

1. Field of the Invention

The invention relates to a method of manufacturing a silicone polymer material comprising at least one metal trace.

2. Description of Related Art

U.S. Pat. No. 6,743,345 "Method of Metallizing a Substrate" to Christian Belouet, et al. teaches a process for metallizing a substrate, having steps of coating the part with a precursor composite material layer consisting of a polymer matrix doped with photoreducer material dielectric particles; irradiating the surface of the substrate with a laser light beam; and immersing the irradiated part in an autocatalytic bath containing metal ions with deposition of the metal ions in a layer on the irradiated surface, and where the dimension of the dielectric particles is less than or equal to 0.5 micrometers [μm]. The process has three steps. The first step is coating the substrate part with a precursor composite material layer consisting of a polymer matrix doped with photoreducer material dielectric particles. The second step is irradiating the surface of the substrate with a light beam emitted by a laser. The third step is immersing the irradiated part in an autocatalytic bath containing metal ions, with deposition of the metal ions in a layer on the irradiated surface, wherein the dimension of the dielectric particles is less than or equal to 0.5 μm.

U.S. Pat. No. 5,599,592 "Process for the Metallization of Polymer Materials and Products Thereto Obtained" to Lucien D. Laude teaches a positive metallization process for metallizing a polymer composite piece containing a polymer material and oxide particles, having steps where oxide particles are one or more oxides, comprising three successive steps. The first step consists of the irradiation of a surface area of a polymer piece to be metallized with a light beam emitted by an excimer laser. The polymer piece is a polymer material and oxide particles. The oxide particles are one or more oxides. The second step consists of immersing the irradiated polymer piece in at least one autocatalytic bath containing metal ions. Immersion induces the deposit of the metal ions onto the irradiated surface area to form a metal film on the surface area, resulting in the selective metallization of the surface area of the polymer piece. The third step is thermally processing the metallized polymer piece to induce diffusion of the deposited metal film into the polymer material of the polymer piece. U.S. Pat. No. 5,599,592 is incorporated herein by reference.

Lucien D. Laude, et al. report that excimer lasers are effective tools in engraving ceramics and polymers, changing irreversibly the surface of the irradiated material, and restricting these effects to specific areas of interest. See L. D. Laude, K Kolev, C I. Dicara and C. Dupas-Bruzek "Laser Metallization for Microelectronics for Bio-applications", Proc. of SPIE, vol. 4977 (2003) pp 578-586.

U.S. Pat. No. 5,935,155, "Visual Prosthesis and Method of Using Same" to Mark S. Humayan, et al. teaches a visual prosthesis comprising means for perceiving a visual image, said means producing a visual signal output in response thereto; retinal tissue stimulation means adapted to be operatively attached to a retina of a user; and wireless visual signal communication means for transmitting the visual signal output to the retinal tissue stimulation means.

U.S. Pat. No. 6,878,643 "Electronic Unit integrated Into a Flexible Polymer Body" to Peter A. Krulevitch, et al. teaches a method of fabricating an electronic apparatus, comprising providing a silicone layer on a matrix, providing a metal layer on the silicone layer, providing a second layer of silicone on said silicone layer, providing at least one electronic unit connected to said metal layer, and removing the electronic apparatus from the matrix wherein the silicone layer and the second layer of a silicone provide a spherical silicone body.

J. Delbeke, et al. teach that silicone rubber biocompatibility is not altered by the metallization method. See V. Cince, M. A. Thil, C. Veraart, I. M. Colin and J. Delbeke, "Biocompatibility of Platinum-Metallized Silicone Rubber: In Vivo and In Vitro Evaluation", *J. Biomater. Sci. Polymer Ed, vol.* 15, no. 2, pp. 173-188 (2004).

There is a need and a high desire for a soft and biocompatible polymer layer with high insulation properties containing embedded very fine metal traces. There is further a need and a high desire for an economical and ecological process of manufacturing such polymer layers.

SUMMARY OF THE INVENTION

One aspect of the present invention is a process for embedding at least one layer of at least one metal trace in a silicone-containing polymer, comprising:
applying a polymer layer on a substrate;
thermally treating the polymer;
irradiating at least one surface area of the polymer with a light beam emitted by an excimer laser;
immersing the irradiated polymer in at least one autocatalytic bath containing ions of at least one metal, and metallizing the polymer;
thermally treating the metallized polymer;
applying a polymer layer covering the thermally treated metallized polymer; and
thermally treating the metallized covered polymer.

Another aspect of the present invention is a polymer layer comprising silicone containing oxide particles of $SiO_2$, $TiO_2$, $Sb_2O_3$, $SnO_2$, $Al_2O_3$, $ZnO$, $Fe_2O_3$, $Fe_3O_4$, talc, hydroxyapatite or mixtures thereof and at least one metal trace embedded in said polymer layer.

Another aspect of the present invention is a flexible electrode array comprising silicone containing oxide particles of $SiO_2$, $TiO_2$, $Sb_2O_3$, $SnO_2$, $Al_2O_3$, $ZnO$, $Fe_2O_3$, $Fe_3O_4$, talc, hydroxyl-apatite or mixtures thereof and at least one metal trace embedded in said polymer layer.

DETAILED DESCRIPTION OF THE INVENTION

Figure 1:
FIG. 1 depicts a cross-sectional view of a substrate.

The present invention relates preferably to the metallization of a polymer, generally silica-based polymers. A more preferred embodiment of the present invention is the metallization of polymers with platinum. The most preferred embodiment is a polymer layer comprising at least one metal trace embedded in the polymer layer.

The preferred polymer of the present invention is a silicone containing polymer. Silicone means, in view of the present invention, any and all possible silicone elastomer formulations, silicone craft polymers, silicone copolymers, silicone-silicone copolymers, silicone-hydrocarbon copolymers, silicone block polymers, silicone block copolymers, silicone rubbers or mixtures thereof. Silicone may contain any type and amount of additives.

The most common method for preparing silicones involves the reaction of a chlorosilane with water. This produces a hydroxyl intermediate, which condenses to form a polymer-type structure. The basic reaction sequence is represented as follows:

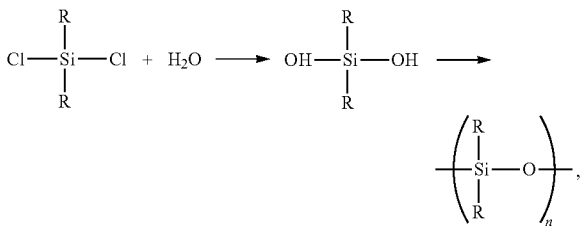

where n is an integer >1.

Other raw materials such as alkoxysilanes can be used as well. Chlorosilanes and other silicone precursors are synthesized by a direct process, involving the reaction of elemental silicone with an alkyl halide as follows: Si+Rx→R$_n$SiX$_{4-n}$ (where n=0 to 4)

Silicone elastomers have high molecular weight, generally greater than 500,000 g/mol. The production of these types of materials requires di-functional precursors, which form polymer structures. Mono and tri-functional precursors form terminal structures and branched structures respectively.

Silicone rubbers contain usually cured additives like peroxides such as benzoyl peroxide, 2,4-dichlorobenzoyl peroxide, t-butyl perbenzoate and dicumyl peroxide. Alkyl hydroperoxides and dialkyl peroxides have also been used successfully with vinyl containing silicones.

Hydrosilylation or hydrosilation is an alternative curing method for vinyl containing silicones and utilizes hydrosilane materials and platinum containing compounds for catalysts. It is a two part process requiring mixing of two separate components, with the resulting material having a limited shelf life. Curing does not produce volatiles and heat cured conventional silicones with high tear strengths can be cured in this way.

Reinforcing fillers are added to improve the otherwise poor tensile strength of silicones. Silica, in the form of silica fume, silica foam, or fumed silica with particle sizes in the range 10 to 40 nm is the most preferred filler, although carbon black has been used. Fillers interact with the vulcanisate, forming a pseudo-vulcanization. This can occur either during mixing and creep hardening or in storage and bin ageing.

Fumed silica has unique properties and is commonly added to liquids/coatings and solids to improve various properties. Fumed silica has chain-like particle morphology. In liquids, the chains bond together via weak hydrogen bonds forming a three dimensional network, trapping liquid and effectively increasing the viscosity. The effect of the fumed silica can be negated by the application of a shear force for example mixing, brushing, spraying etc., allowing the liquid to flow, level out and permit the escape of entrapped air.

One production method for the production of fumed silica involved a continuous flame hydrolysis technique. It involves the conversion of silicon tetrachloride (SiCl$_4$) to the gas phase using an oxygen hydrogen flame. It then reacts with water to yield silica (SiO$_2$) and hydrochloric acid thus:

$$SiCl_4+H_2O \rightarrow SiO_2+HCl$$

HCl can easily be separated as it remains in the gas phase, while SiO$_2$ is solid in the form of fumed silica.

Silicone can be in large variation of shapes and forms, such as thin sheets obtained by spun coating or spray coating, foil obtained by lamination or molding, bloc molded pieces, distributed silicone, silicone mixed with thermoplastic material.

The present invention provides a cured silicone layer which has a preferred thickness of 10 to 80 μm, preferably 20 to 40 μm. This layer contains laser-drawn traces up to 10 to 20 μm traces or pads with a dimension of 100 to 200 μm which are filled with metallized deposit.

The present invention further provides a silicone layer which has a preferred thickness of 15 to 25 μm. This layer contains laser-drawn traces having a width of to 10 to 20 μm which are filled with metallized deposit, preferably with Pt. This layer contains further a second 15 to 25 μm thick silicone layer covering the once metallized first silicone layer. After curing that second silicone layer an optimum silicone-to-silicone adhesion of the second silicone layer provides a fully protected cover to the metallized silicone layer. A full silicone-encapsulation of the metal traces is thereby obtained.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the invention, the final silicone cover remains unmetallized and serves solely for the purpose of protecting and insulating the underlying metallized silicone layers. That silicone cover may be formed with a silicone that is different from the silicone that has been used for the underlying layers. In particular, it may not contain silica foam at all and may then be more readily applied even to very small layer thickness. Therefore, a silicone cover of 15 to 20 μm is formed on the metallized silicone layer. That silicone cover is formed with a silica foam free silicone that is spun onto the metallized silicone before curing as above.

In the metallization process a non-organic powder is dispersed in any given polymer, for example polyamide. The non-organic powder is for example at least one oxide of antimony, aluminum, iron, zinc or tin. The oxide particles have variable particle sizes, preferably smaller than about 50 μm. The concentration of the oxide particles in the polymer exceeds about 1 vol.-% or 1 wt.-%.

The surface of the polymer material is irradiated with the light beam emitted by a laser. The light is emitted preferably in the ultraviolet wavelength range, during a very short duration or pulse and repeated, if necessary, at regular time intervals. The pulsed emission preferably has high energy, for example, between 0.05 and 1.0 J. It contains a very large number of photons. It may also operate at a wavelength less than or equal to about 350 nm which corresponds to photon energy approximately equal to or larger than 3.5 eV. The desired emission may be obtained from an excimer laser source emitted during about 10 ns, at a wavelength of about 248 nm which corresponds to photon energy of 5.0 eV.

The laser beam may be passed through a mask having a specific geometry, and projected upon focalization on the surface of the material to be treated. A desired processing is obtained beyond a given energy density of about 0.5 J/cm$^2$, or fluence, and as a function of the material optical properties and the laser photon energy.

The method wherein the pulsed ultraviolet light beam having an axis and an intensity is homogenized by passing the pulsed ultraviolet light beam through a homogenizing optical system which homogenizes the intensity of the light beam.

The method wherein the homogenized light beam passes through at least one square, rectangular or circular planar mask, the planar mask being disposed in a plane perpendicular to the axis of said light beam, the planar mask being interposed between the excimer laser and the polymer layer.

In case of pure silicone, UV laser irradiation may produce two effects that depend on both fluence and photon energy.

At 248 nm, therefore at 5 eV, the silicone undergoes partial decomposition by breaking the Si—C bonds. This results in ablation of the C-radicals but leaves unaffected the Si—O bonds of the polymer backbone.

At lower wavelengths for example at 193 nm, therefore at 6.2 eV, the silicone undergoes total decomposition by breaking both Si—C and Si—O bonds. This results in a full ablation of silicone, typically at a rate of some 0.5 μm per pulse at 0.5 mJ/cm$^2$, and irrespective of the silicone formulation.

In the case of silicone containing silica, for example silica foam, the 248 nm laser radiation has no effect on the silica particles but the 193 nm does, which leads to a complete ablation of the silicone and its silica additive.

In the second part of the process, silicone treated with the 248 nm laser is immersed in an autocatalytic bath that contains metal ions, for example $Ni^{2+}$, $Cu^{2+}$, or $Pt^{2+}$. The method wherein the irradiated first polymer layer is carried by a moving carrier and is delivered to the autocatalytic bath and the irradiated first polymer layer is immersed by the moving carrier in the autocatalytic bath. These ions are selectively driven to deposit and react on the partially decomposed silicone structure regardless if the treated silicone contains an additive, for example silica foam, or not. The reaction between metal ions and the polymer results in covalent bonding on the Si atoms of the polymer that lost their C-radicals upon irradiation. In the absence of silica foam, metallization occurs but with a poor adhesion of the metallized silicone part. The presence of silica foam enforces substantially the metallized silicone that is obtained after laser treating at 248 nm, since silica remains unaffected at 248 nm.

In contrast, irradiating silicone at 193 nm provides a very efficient way to fully and exclusively ablate silicone, containing silica foam or not. In particular, irradiating silicone at 193 nm creates clean and well defined cuts, grooves, blind holes or vias. Silicone parts engraved by 193 nm do not metallize by immersing in an autocatalytic bath.

During immersion of the laser processed surface into the autocatalytic bath, metallization is restricted to the laser treated surface. The incubation time measures the period of time which is necessary to form a continuous metal film on the composite surface. After that time, the metal deposition, which is usually 10 to 20 µm per hour for Ni, may develop perpendicular to the surface in an efficient manner.

The advantages of the process of the present invention result directly from the use of an intense and pulsed ultraviolet light beam, as for instance the light beam emitted by an excimer laser source at a wavelength equal or less than 308 nm. All other light sources working in the visible or infrared range, in pulsed or continuous regime, are ineffective on silicone.

The preferred irradiation source according to this invention is an excimer laser, although a pulsed quadrupled YAG laser may also be used. The preferred excimer laser performs engraving at about 248 nm with partial decomposition of silicone and allows metallization. The laser pulse duration is in the range of 1 to 40 ns by steady or scanning irradiation. In comparison engraving below about 200 nm performs full ablation but no metallization can follow after the ablation.

A silicone layer is spun on a clean glass plate and cured in an oven. The layer may have a near constant thickness at about 40 µm across the glass substrate. The thickness depends on spinning conditions and the content of additives. The higher the content of additives is the more difficult is the spinning. This layer is then scanned with a focused 248 nm excimer laser beam working at a sufficient fluence that allows partial decomposition of the silicone material down to some 10 to 15 µm into the layer. The laser processed silicone layer, on its glass substrate, is further immersed in an electroless bath containing metal ions. Subsequently, the latter ions condense solely on the laser-processed areas of the silicone layer where they contribute to form metallized deposits precisely in the laser-drawn areas and remain embedded in the silicone layer without touching the glass substrate underneath.

After preparing the metallized silicone layer on a glass substrate, a second 20 µm thick silicone layer is spun on the once metallized first silicone layer and cured in oven. An optimum silicone to silicone adhesion of the latter is thus achieved that provides a fully protected cover to the metallized silicone layer. The set of two silicone layers may then be pulled from the glass substrate and materializes the full silicone-encapsulation of the once produced metal traces.

Silicones have a formulation that contains generally a variable amount of silica foam additive that serves to strengthen the polymeric structure in various ways. This additive or other form of silica for example fiber also favors the electroless-metallization process and improves substantially the mechanical behavior of metallized silicone. However, the final silicone cover remains un-metallized and serves solely the purpose of protecting the underlying metallized layers. That silicone cover may be formed with a silicone that is different from the one silicone that has been used for the other underlying layers. In particular, it may not contain silica at all and may then be more readily spun, even to very small layer thickness. Therefore, a silicone cover of 20 µm is formed on the last metallized silicone layer. That silicone cover is formed with a silica-free silicone that is spun onto the metallized silicone before curing as above.

The electroless Pt-metallization proceeds via forming a thin so-called black metal film and then goes on a second step of Pt-deposit that thickens the metal layer. That second step is extremely slow being impaired in particular with the formation of H-bubbles on a quite uneven metallizing surface; bubbles that tend to obliterate the surface and limit its direct contacting to the electroless bath. Accelerating this second metallization step may be performed as follows.

After having initiated that second step, the silicone layer on its substrate is removed from the bath and its surface is blown for a few seconds with a hot air jet as produced by a standard air gun. The jet cleans up the surface and heats up the metal deposit. The layer is then returned to the bath for a period of 5 to 10 minutes before being removed again from the bath, re-blown as before and re-immersed in the bath. The process is repeated regularly (and automated eventually) at 5 to 10 minutes intervals until the necessary metal thickness has been attained. With this transient heat procedure, time reduction from 2 to 3 hours to 30 minutes in the process of Pt-metallizing is substantial and the metal deposit may attain a large thickness that may not be accessible without it.

The present invention will be further illustrated by the following exemplary explanation of the figures, but it is to be understood that the invention is not meant to be limited to the details described herein. The figures explain the preferred process for producing a silicone layer containing embedded Pt traces.

FIG. 1 depicts a cross-sectional view of a substrate 1. The substrate 1 is a rigid supporting substrate preferably made of glass, molded silicone, ceramic, semiconductor, at least one metal, or at least one metal alloy.

Figure 2:
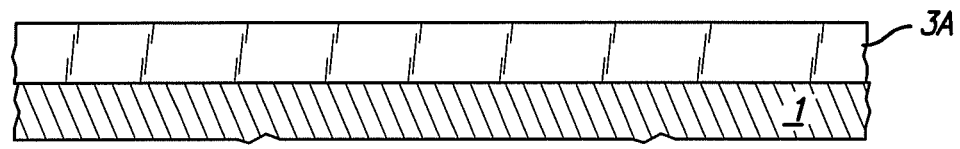
FIG. 2 depicts a cross-sectional view of a substrate and a first polymer layer after curing.

FIG. 2 depicts a cross-sectional view of the substrate 1 and a first silicone layer 3A after curing. The silicone is preferably applied and distributed by spun coating. Then the sample is heat treated to perform curing of the silicone layer 3A. The silicone layer 3A is about 20 µm thick.

Figure 3:
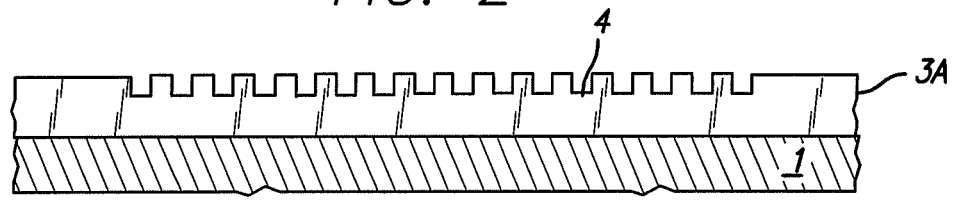
FIG. 3 depicts a cross-sectional view of a substrate and a cured first polymer layer after laser treatment.

FIG. 3 depicts a cross-sectional view of a substrate 1 and a cured first silicone layer 3A after laser treatment. The desired emission may be obtained from an excimer laser source emitting during about 10 ns, at a wavelength of about 248 nm which corresponds to photon energy of 5 eV. The threshold energy density may be obtained by focusing the laser beam on the irradiated surface and is usually at 0.5 $J/cm^2$. The laser beam cuts traces 4 with a preferred trace width of 5 to 15

Figure 4:
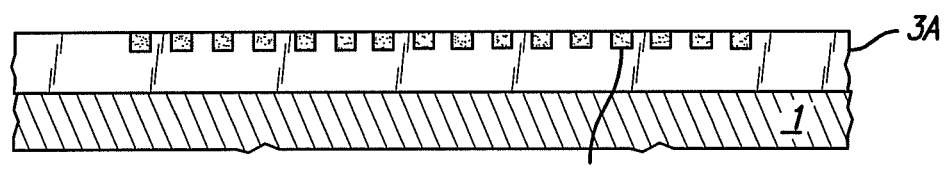
FIG. 4 depicts a cross-sectional view of a substrate and a cured first polymer layer after metallization whereby metal traces are obtained.

FIG. 4 depicts a cross-sectional view of a substrate (1) and a cured first silicone layer 3A after metallization of the engraved traces 4 whereby Pt traces 5 are obtained. The silicone layer 3A is immersed in a Pt autocatalytic bath whereby deposition of Pt is induced on.

Figure 5:
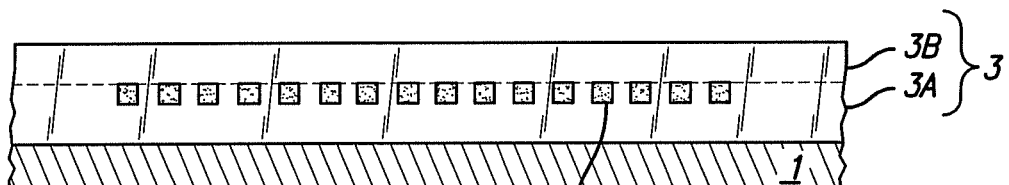
FIG. 5 depicts a cross-sectional view of a substrate and a cured first polymer layer after disposing a second polymer layer on top of the first polymer layer and the metal traces.

FIG. 5 depicts a cross-sectional view of a substrate 1 and a cured first silicone layer 3A after disposing a second silicone layer 3B on top of the first silicone layer 3A and the Pt traces 5. The second silicone layer 3B is of 15 to 20 µm thick.

The used silicones have a formulation that contains generally a variable amount of silica foam additive that serves to strengthen the polymeric structure in various ways. It also favors the electroless-metallization process and improves substantially the mechanical behavior of metallized silicone. The final silicone cover can remain un-metallized and serves solely to the purpose of protecting from ambient of the underlying metallized layers. That silicone cover may be formed with a silicone that is different from the one silicone that has been used for the other underlying layers. In particular, it may not contain silica at all and may then be more readily spun, even to very small layer thickness. Therefore, the silicone cover can be formed with a silica-free silicone that is spun onto the multi-layered metallized silicone before curing as above.

Figure 6:
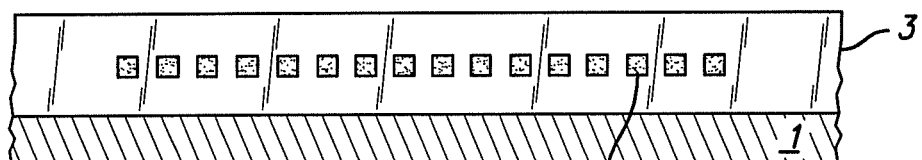
FIG. 6 depicts a cross-sectional view of a substrate and a cured first polymer layer and metal traces after curing the second polymer layer.

FIG. 6 depicts a cross-sectional view of a substrate (1) and a cured first silicone layer 3A and Pt traces 5 after curing the second silicone layer 3B.

Figure 7:
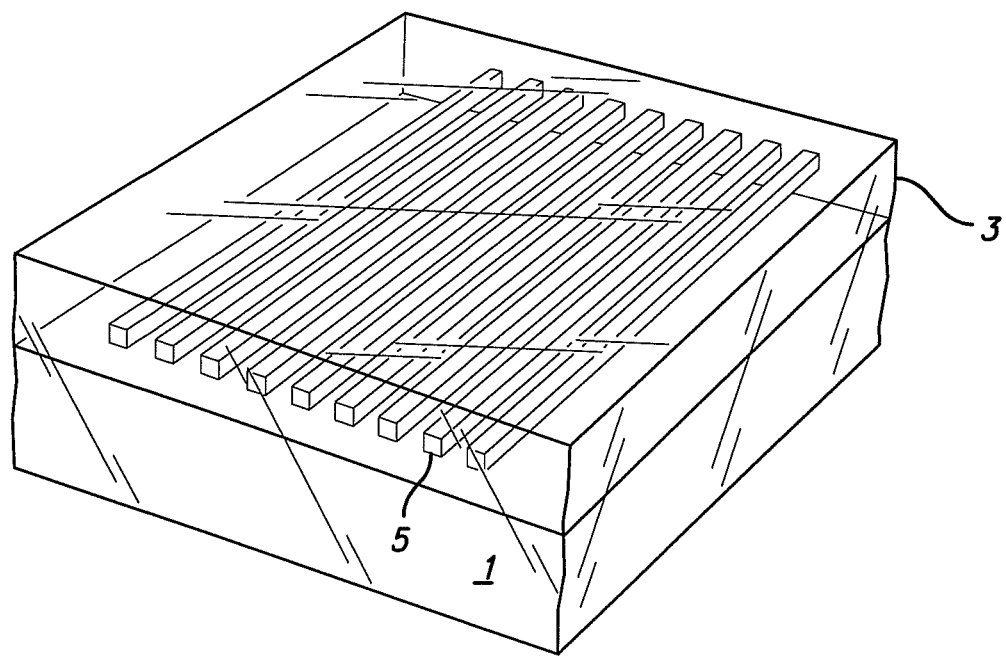
FIG. 7 depicts a perspective view of a cured polymer layer with one embedded series of metal traces as shown in FIG. 6.

FIG. 7 depicts a spherical view of a substrate 1 and a cured silicone polymer layer 3 with one embedded series of Pt traces 5. The first silicone layer 3A and the second silicone layer 3B become one silicone polymer layer 3 after curing as shown in FIG. 6.

Figure 8:
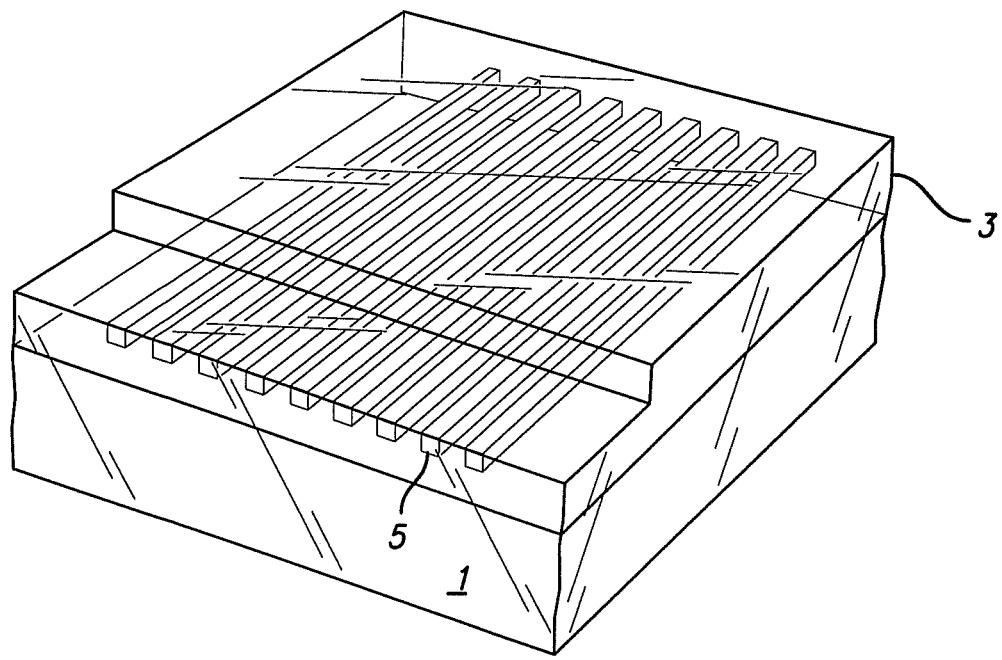
FIG. 8 depicts a perspective view of a cured polymer layer with one embedded series of metal traces as shown in FIG. 6 after a cut out of the polymer.

FIG. 8 depicts a view of a cured silicone polymer layer 3 with one embedded series of Pt traces 5 after a cut out of the silicone as performed by laser irradiating at about 193 nm to enable connection of the Pt traces 5 to external electrodes or other devices.

Figure 9:
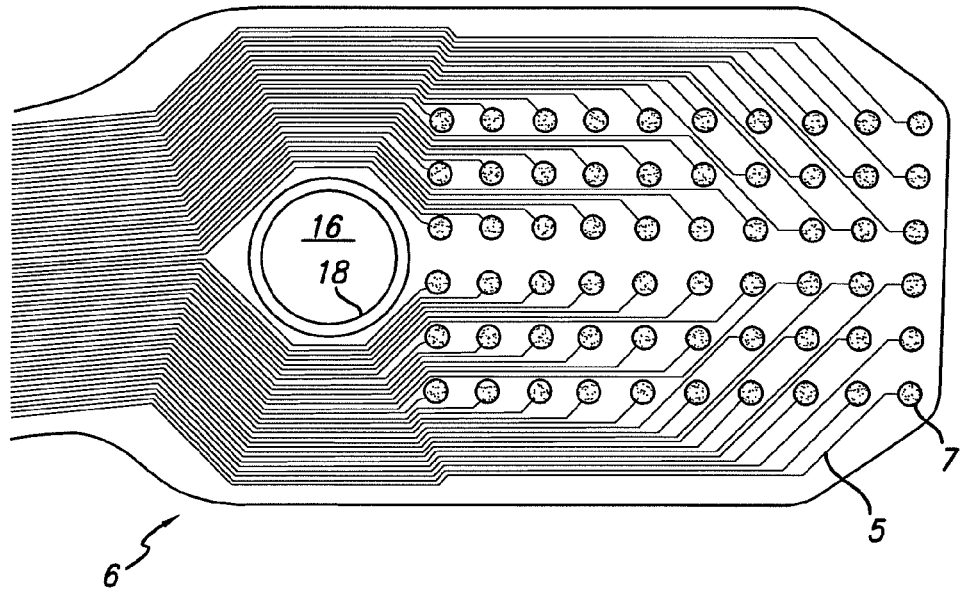
FIG. 9 depicts a top view of a flexible circuit electrode array.
Figure 10:
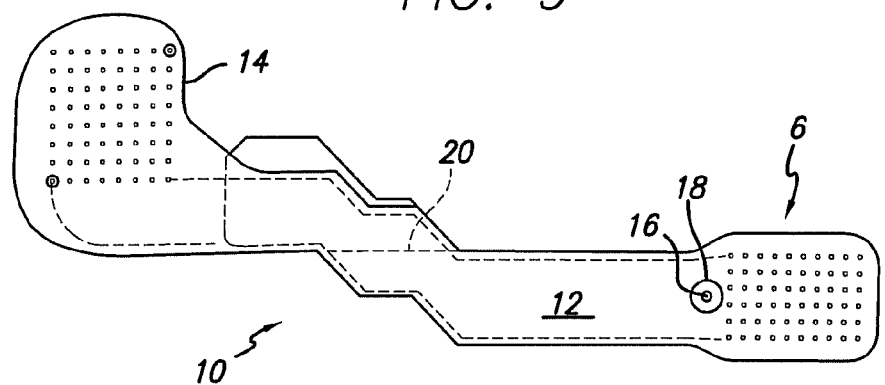
FIG. 10 depicts a top view of a body comprising a flexible circuit electrode array, a flexible circuit cable and a bond pad before it is folded.
Figure 11:
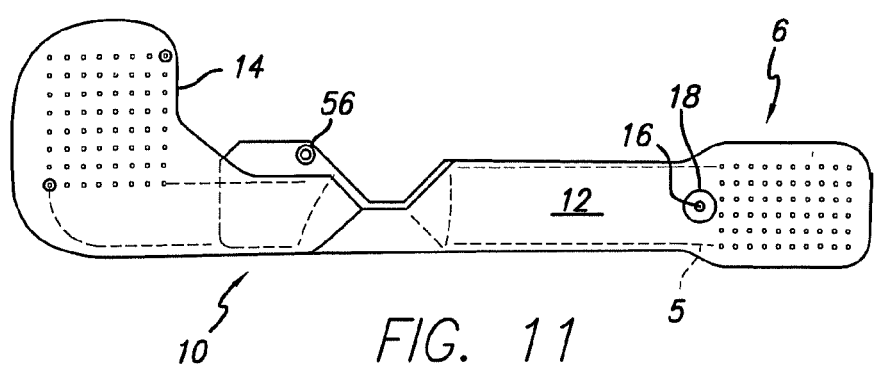
FIG. 11 depicts a top view of a body comprising a flexible circuit electrode array, a flexible circuit cable and a bond pad after it is folded.

FIG. 9 depicts an enlarged top view of a flexible circuit electrode array 6 which is a part of the body 10 as shown for example in FIGS. 10 and 11. The preferred positions of the electrodes 7 and the preferred wiring by the metal trace 5 both embedded in the polymer layer 3 are shown in FIG. 9. The metal trace 5 preferably contains platinum. The electrodes 7 preferably contain platinum. The preferred flexible circuit electrode array 6 of the invention comprises cured silicone polymer layer 3 containing $SiO_2$ in which platinum metal traces (5) are embedded and which contains platinum electrodes 7.

FIGS. 10 and 11 depict a body 10 containing the flexible circuit electrode array 6, a flexible circuit cable 12 and the interconnection pad 14. At one end of the flexible circuit cable 12 is an interconnection pad 14. At the other end of the flexible circuit cable 12 is the flexible circuit electrode array (6. Further, an attachment point 16 is provided near the flexible circuit electrode array 6. A retina tack (not shown) is placed through the attachment point 16 to hold the flexible circuit electrode array 6 to the retina. A stress relief 18 is provided surrounding the attachment point 16. The stress relief 18 may be made of a softer polymer than the flexible circuit, or it may include cutouts or thinning of the polymer to reduce the stress transmitted from the retina tack to the flexible circuit electrode array 6. FIG. 10 depicts that the flexible circuit cable 12 is formed in a dog leg pattern so then when it is folded at fold 20 it effectively forms a straight flexible circuit cable 12 with a narrower portion at the fold 20 for passing through the scleratomy. FIG. 11 depicts the flexible circuit electrode array 6 after the flexible circuit cable 12 is folded.

Figure 12:
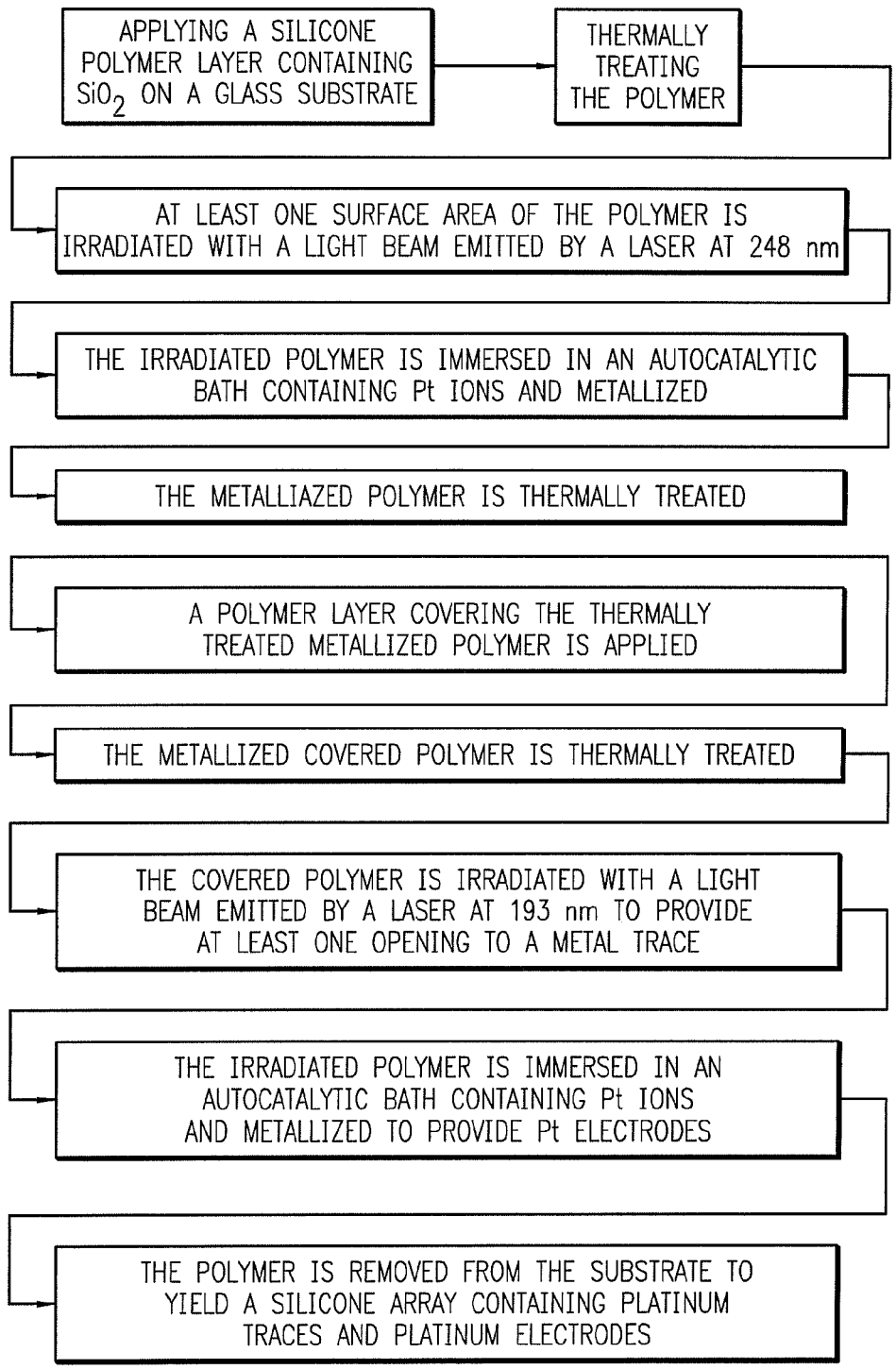
FIG. 12 depicts a flow chart explaining an example of the process.

FIG. 12 depicts a flow chart which is an example for the manufacturing of a flexible electrode array containing a polymer comprising silicone, $SiO_2$, and platinum traces and electrodes.

The present invention provides a multi-layer metallized silicone. The second and last layer is laser irradiated and metallized as previously taught. The new metallized traces in the second layer remain within the engraved part of that layer to 5 to 10 µm. The traces remain separated from the underlying metallized traces in the first layer by about 10 µm. Undesired interconnects between the two sets of metallized traces are avoided. The two-layer silicone structure is then covered with a final, cured virgin silicone layer. A silicone-encapsulated 3-dimensional structure that contains two sets of independent metallized Pt-traces is obtained.

The present invention provides interconnection in multi-layered silicone 3-dimensional structure. In order to get access to the underlying Pt-traces, irradiation with the same excimer laser source working at 248 nm is performed onto the cover at an area that overlaps a section of an underlying Pt-trace. Decomposition of silicone is performed at the site and maintained upon repeated pulsed-irradiation. The procedure drives silicone out of that area and cuts the layer until reaching the underlying Pt-trace to open a window to the embedded Pt-circuit. The window is filled with Pt after metallization down to the underlying trace. A new laser-irradiation of that second silicone layer that is now equipped with the metallized window is performed along a path that crosses the metallized window. A further immersion in the autocatalytic bath results in the metallization of the path while bringing additional metal to the window. In that way, a direct interconnect is obtained between the upper lying trace in the second silicone layer and the lower lying trace in the first one.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the present invention, the final silicone cover remains un-metallized and serves solely for the purpose of protecting the underlying metallized layers from ambient. That silicone cover may be formed with a silicone that is different from the one silicone that has been used for the other underlying layers. In particular, it may not contain silica foam at all and may then be more readily applied even to very small layer thickness. Therefore, a silicone cover of 15 to 20 µm is formed on the last metallized silicone layer. That silicone cover is formed with a silica foam free silicone that is spun onto the multi-layered metallized silicone before curing as above.

The present invention provides silicone with a spherical geometry. The cured silicone surface with spherical geometry is scanned with an excimer laser and followed by a subsequent platinum-metallization of the resulting laser-produced trace. A second silicone layer is further spun on this metallized silicone surface and cured in an oven. That silicone structure is not planar but curved.

The present invention provides metallized spherical, silicone molded substrates. Silicone rubber is injected in an hemispherical mold. After demolding the resulting silicone piece a laser beam is scanned on its molded hemispherical surface and the resulting laser-processed traces are Pt-metallized.

The invention provides metallizing of an expanded silicone layer for enhanced metal imbedding. A silicone layer is applied on a glass cylinder. After inscribing the laser-processed traces on the convex, expanded silicone surface, the silicone layer on the glass cylinder is placed in an electroless Pt bath for metallization of the traces. The metallized silicone layer is detached from the glass cylinder and recovers its original planar geometry. The expanded Pt-traces contract and encloseg the metal parts in silicone, providing an enhanced integration of the traces in the silicone layer.

The invention relates to an improved process for positive metallization of a polymer surface. In this metallization process a inorganic powder is dispersed in the polymer, for example polyamide. The inorganic powder is, for example, at least an oxide of antimony, aluminum, iron, zinc or tin. The oxide particles have variable grain sizes, preferably smaller than 50 μm. The concentration of the oxide grains in the polymer exceeds about 1 vol.-% or 1 wt.-%.

In the first step of the process, the surface of the polymer material or composite is irradiated with the light beam emitted by a laser. The light is preferably emitted in the ultraviolet range, during a very short duration or pulse and repeated, if necessary, at regular time intervals. The pulsed emission preferably has high energy, for example, between 0.05 and 0.2 J. It contains a very large number of photons. It may also operate at wavelengths below or equal to 350 nm which corresponds to photon energy approximately equal to or greater than 3.5 eV. The desired photon energy may be obtained from an excimer laser source emitting for 20 nanoseconds, at a wavelength of 248 nm, which corresponds to a photon energy of 5 eV. The threshold energy density may be obtained by focusing the laser beam on the irradiated surface, and is about 0.5 J/cm$^2$.

The process of radiation has two effects, if the above energy density, threshold energy, and value which depends on the nature and concentration of the oxide grains in the composite are applied:

a) the base material itself, for example the polymer, undergoes a superficial ablation of about 0.2 μm per pulse; and b) depending on the choice of the incorporated granular substance, the radiation creates a high concentration of polarized defects at the surface of the oxide grains.

The defects are a consequence of breaking some of the interatomic bonds at the surface of the oxide grains. They result from the combined actions of the electronic excitations which take place within these bonds following the absorption of the laser photons by the grains. The actual concentration of defects at the surface of the oxide grains is proportional to the laser energy density, resulting from the laser beam focusing at the surface of the composite.

In the second step of the process, and without any other intermediate steps, the laser-treated material is directly immersed in an autocatalytic bath containing metal ions, for example Pt$^{2+}$. The metal contained in the bath is selectively driven to deposit on the sections of polymer surface which have been previously irradiated by the laser beam and which contain the polarized defects produced by the irradiation. The invention does not have to apply any substances containing palladium to control the Pt$^{2+}$ polymer surface metallization due to the defects on the oxide grains. The metallization is directly induced by the superficial defects which are laser-created on the oxide grains present at the composite surface.

The incubation time decreases when the laser energy density increases. The thickness of the Pt deposition of 20 or 5 micrometers per hour in a Pt bath after the incubation is approximately proportional to the actual immersion time.

The interface between the composite and the metal film is rough as a result of the partial ablation of the polymer surface. The interstitial coupling, either by covalent or strong ionic bonds of the metal ions from the autocatalytic bath onto the superficial grain defects of that roughened surface is selective and strong. The adhesion of the metal deposition to the polymer is remarkably high. The adhesion of the metal film to the polymer surface is performed by the superficially metallized oxide grains, which are present at the composite surface. The resulting metal adhesion attains a strength of about 10 MPa.

The adhesion of the metal film to the polymer surface may be further increased by letting the metal diffuse towards the inner part of the polymer. This can be performed by selectively heating the metal film during a short period of time, for example in a microwave oven. During that period, the polymer and the other non-metallic components of the complex, formed by the polymer and the metal film, are not affected by the microwaves emitted in the oven and, therefore do not heat. The emitted waves selectively heat the metal which may then diffuse into the polymer.

The modifications produced at the polymer surface by the ultraviolet light beam are restricted to those areas which have been irradiated. The precise definition of the limits to those areas is further proportional to the actual wavelength, which is preferably chosen to be less than 350 nm.

The surface sensitivity to the laser radiation depends for every polymer formulation on the incident laser energy density. During immersion of the laser processed surface into the autocatalytic bath, metallization is restricted to the surface of the oxide grains which emerge from the composite. Then, metallization proceeds at random from those grain sites and covers the whole of the laser processed surface area of the composite. The incubation time measures the period of time which is necessary to form a continuous metal film on the composite surface. After that time, the metal deposition, which is usually 20 micrometers per hour for Ni, may develop perpendicular to the surface.

The thickness of the metal film increases homogeneously on the laser processed polymer surface, whatever the polymer formulation and initial laser processing applied. The laser energy density which is utilized for irradiation can be very for a given polymer. The areas which are irradiated at high energy density have an incubation time at the time of immersion in the autocatalytic bath of about 10 minutes. The areas which are irradiated at lower energy density have an incubation time of about 50 minutes.

The process allows producing metal films with varied thicknesses on the same polymer surface during a single immersion of the irradiated polymer in an autocatalytic bath.

The advantages of the process result directly from use of an intense and pulsed ultraviolet light beam, as for instance the one emitted by an excimer laser source working at a wavelength equal to or less than 308 nm. Other light sources working in the visible or infra-red range, in pulsed or continuous area, cannot produce structural or compositional polarized defects on the oxide grains.

The preferred irradiation source according to this invention is an excimer laser. The preferred excimer laser performs engraving at 248 nm with partial decomposition and allows metallization. In comparison engraving below 200 nm performs full ablation, however no metallization can occur after ablation. The laser pulse duration is in the range of 1 to 40 ns by steady or scanning irradiation.

The preferred metallization includes the following steps
PMMA coating prior irradiation
standard electroless process with platinum salt
multi-bath procedure at 50° C.
intercalated transient heat treatment
dissolving PMMA after metallization The overall process of metallizing silicone involves the following preferred process steps.

Spinning Silicone

A silicone layer is spun on a clean glass plate and cured in an oven. The layer has a constant thickness at 40 μm across the glass substrate. This layer is scanned with a focused 248 nm excimer laser beam working at a sufficient fluence that allows partial decomposition of the silicone material to about 10 to 15 μm into the layer. The laser processed silicone layer, on its glass substrate, is then immersed in an electroless bath containing Pt ions. Subsequently, the latter ions condense solely on the laser-processed areas of the silicone layer, where they contribute to form metallized deposits that precisely decorate the laser-drawn areas and remain embedded in the silicone layer without touching the glass substrate.

Easy-Pull Silicone/Glass Interface

Figure 13:
FIG. 13 depicts a cross-sectional view of a substrate.
Figure 14:
FIG. 14 depicts a cross-sectional view of a substrate and a layer of a non adhering agent.
Figure 15:
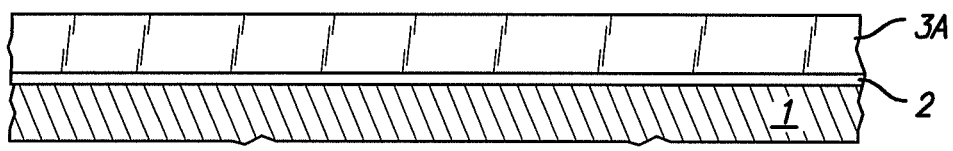
FIG. 15 depicts a cross-sectional view of a substrate and a layer of a non adhering agent and a first polymer layer after curing.
Figure 16:
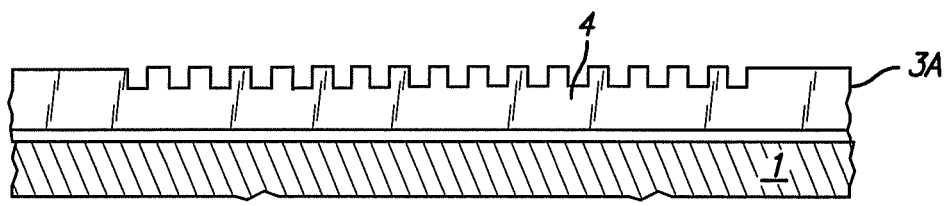
FIG. 16 depicts a cross-sectional view of a substrate and a layer of a non adhering agent and a first polymer layer after laser treatment.
Figure 17:
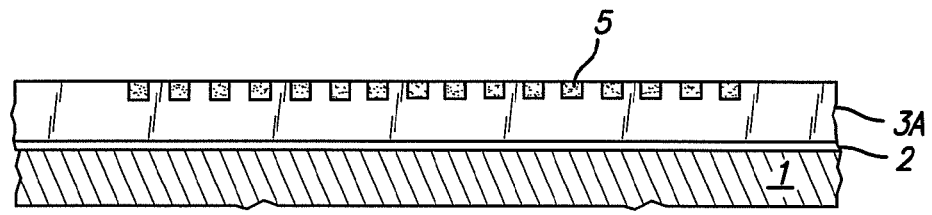
FIG. 17 depicts a cross-sectional view of a substrate and a layer of a non adhering agent and a first polymer layer after metallization whereby metal traces were obtained.
Figure 18:
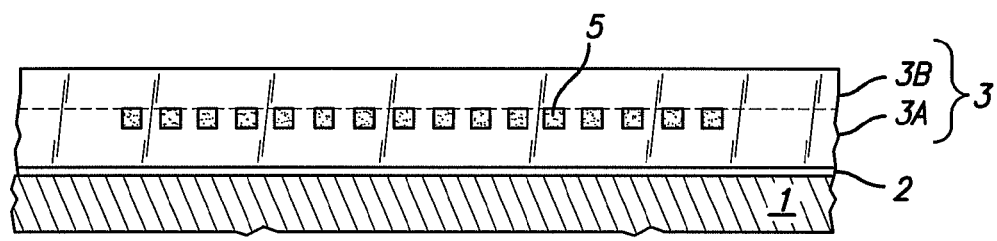
FIG. 18 depicts a cross-sectional view of a substrate and a layer of a non adhering agent and a first polymer layer after disposing a second polymer layer on top of the first polymer layer and the metal traces.

A glass plate is coated on one of its faces with a non adhering layer 2, such as $CaF_2$ or $MgF_2$ film, as shown in FIGS. 13 and 14. A silicone layer is then spun onto the coated face of the glass plate and forms a 10 to 30 μm thick layer. That layer is cured in an oven before being scanned with a focused 248 nm excimer laser beam. The laser beam induces partial decomposition of the silicone material and engraves it to a depth of 10 to 15 μm. Immersion in a Pt autocatalytic bath induces deposition of Pt on these engraved traces, as in Example 1 above. Because of the poor adhesion of silicone on the $MgF_2$ film, the metallized silicone layer is further pulled from the $MgF_2$ coated glass plate and made free, as shown in FIGS. 13 to 20.

Silicone Cover for Encapsulating Metallized Silicone

Figure 19:
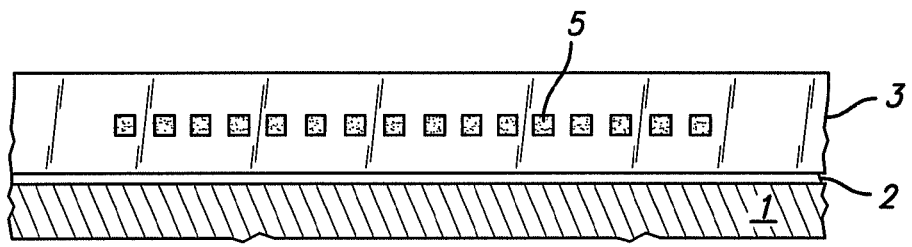
FIG. 19 depicts a cross-sectional view of a substrate and a layer of a non adhering agent and a first polymer layer and metal traces after curing the second polymer layer.
Figure 20:
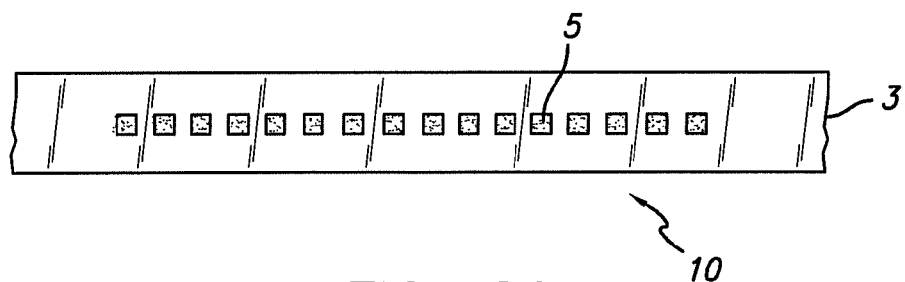
FIG. 20 depicts a cross-sectional view of a polymer layer with one embedded series of metal traces after removing from the rigid substrate.

After preparing the metallized silicone layer 2 on $MgF_2$ coated glass substrate 1, a second 10 to 30 μm thick polymer layer 3, such as a silicone layer, is spun on the metallized first silicone layer and cured in an oven, FIG. 19. An optimum silicone to silicone adhesion is achieved thus providing a fully protected cover of the metallized silicone layer. The two silicone layers are pulled from the glass substrate and yields silicone-encapsulation of the Pt traces, FIGS. 16 to 19.

Multi-Layering Metallized Silicone

Before pulling two polymer layers, such as silicone layers, the second and last layer is laser irradiated and metallized, as previously discussed. The new metallized traces in the second layer remain within the engraved part of that layer down to approximately. 5 to 15 μm, i.e., still separated from the underlying metallized traces in the first layer by about 5 to 15 μm and, thus, avoiding undesired interconnects between the two sets of metallized traces. The 2-layer silicone structure is covered with a final, cured virgin silicone layer. The resulting 3-layer structure is pulled from the $MgF_2$ coated glass substrate, materializing a silicone-encapsulated 3-dimensional structure that contains two sets of independent metallized Pt-traces, as presented in FIGS. 24 to 27.

Interconnection in Multi-Layered Silicone 3-D Structure

A first silicone layer is spun on a $MgF_2$ covered glass substrate. The outer surface of that first layer is further excimer laser processed and Pt-metallized. A second silicone layer is spun on the metallized silicone surface to form a cover to the first layer. In order to get access to the underlying Pt-traces, irradiation with the excimer laser source at 248 nm is performed on the cover at an area that overlaps a section of an underlying Pt-trace. Decomposition of silicone is performed at the site and maintained by repeated pulsed-irradiation. The procedure drives silicone out of that area and penetrates the layer until reaching the underlying Pt-trace.

Having opened a window to the embedded Pt-circuit, the silicone structure on its glass substrate is immersed in a Pt-autocatalytic bath that drives the metallization into the window to the underlying trace and ultimately fills the window with Pt. A new laser-irradiation of the second silicone layer, that now has the metallized window, is performed along a path that crosses the metallized window. Further immersion in the autocatalytic bath results in metallization of the path while bringing additional metal to the window. In that way, a direct interconnect is created between the upper lying trace in the second silicone layer and the lower lying trace in the first silicone layer.

Actual Laser Wavelength for Boring Windows in Silicone

Similar to Example 5 but the excimer laser source is operated at 193 nm, 6.2 eV photon energy, when opening the windows to the second silicone layer. Full decomposition of silicone is achieved in contrast with the partial decomposition resulting from irradiation at 248 nm. At the 193 nm wavelength, decomposition and emission of matter: (i) is far more efficient (i.e., more rapid) than at 248 nm, and (ii) leaves a clean and smooth opening to the underlying trace.

Overlapping Silicones with Different Formulations

In the previous examples, silicones have a formulation that contains a variable amount of silica foam additive, which strengthens the polymeric structure in various ways. It also favors the electroless-metallization process and improves the mechanical behavior of metallized silicone. However, the final silicone cover remains un-metallized and serves the sole purpose of protecting the underlying metallized layers. The silicone cover may be formed with a silicone that is different from the silicone that is used for the other underlying layers. In particular, it may not contain silica at all and may be more readily spun, even to a very thin layer thickness Therefore, following Examples 3 and 4 above, a silicone cover of 20 μm is formed on the last metallized silicone layer. That silicone cover is formed with a silica-free silicone that is spun onto the multi-layered metallized silicone before curing, as above.

Spinning Silicone on a Spherical, $MgF_2$-Coated Glass Surface

A plano-convex lens is coated on its convex surface with a $MgF_2$ film. Then, the lens is positioned and fixed solidly on a turntable having: (i) its planar, uncoated surface directly in contact with the turntable surface, and (ii) its axis precisely along the turntable rotation axis. A known amount of silicone is then positioned about the center of the convex surface of the lens and the turntable is rotated.

The silicone spreads by spinning over the entire convex surface. After a period of time, on the order of 1 minute, rotation is stopped and a silicone layer is formed over the convex surface and the silicone-covered lens is placed in an oven to cure the silicone. As in the previous examples, the cured silicone surface is scanned with an excimer laser beam followed by platinum-metallization of the laser-produced trace. A second silicone layer is then spun on the metallized silicone surface and cured in the oven. The final silicone bi-layered structure is pealed off its convex $MgF_2$-coated glass substrate. The pealed-off silicone structure is not planar but curved, having duplicated the spherical geometry of the lens substrate on which it has been formed.

Metallizing a Spherical, Silicone Molded Substrate

Silicone rubber is injected in a hemispherical mold. After demolding the resulting silicone piece and, as in all preceding examples, a laser beam is scanned on its molded hemispherical surface and the resulting laser-processed traces are further Pt-metallized. Similar to Example 8, a silicone layer is spun on the hemispherical metallized silicone surface.

Metallizing an Expanded Silicone Layer for Enhanced Metal Imbedding

Silicone is spun on a planar, $MgF_2$-coated glass substrate, oven-cured and pealed off its substrate. The pealed-off layer is then mounted to adhere gently but uniformly to the surface of a $MgF_2$-coated glass cylinder in such a way that the actual cylinder diameter does allow the silicone layer to run around the cylinder without overlapping itself. The silicone-covered cylinder is mounted on a motorized rotation axel and that motorized axle is positioned on an x-y table that moves the motorized axle in a plane parallel to the axis of the axle. Laser processing the silicone layer is further performed with the laser axis perpendicular to the cylinder axis while moving it along with the x-y table. After inscribing the laser-processed traces on the convex, expanded silicone surface, the silicone layer on its glass cylinder is placed in an electroless Pt bath for metallization of the traces. The metallized silicone layer is detached from the glass cylinder and recovers its original planar geometry. The expanded Pt-traces (at the time of their production) contract. The metal parts are enclosed in silicone and provide enhanced integration of these traces into the silicone layer.

Accelerating Pt-Metallization of Silicone

The electroless Pt-metallization proceeds via forming a thin black Pt film undergoes a second Pt-deposit that thickens the metal layer. The second step is extremely slow, being impaired in particular by the formation of hydrogen-bubbles on an uneven metallizing surface. The bubbles tend to obliterate the surface and to limit its direct contact to the electroless bath. Acceleration of this second metallization step is accomplished as follows.

After having initiated that second step, the silicone layer on its substrate is pulled out of the bath and its surface is blown for a few seconds with a hot air jet as produced by a standard air-gun. The jet cleans up the surface and heats up the metal deposit. The layer is then returned to the bath for a period of 5 to 10 minutes before being pulled again from the bath, re-blown as before and re-immersed in the bath. The process is repeated at 5-10 minute intervals until the desired metal thickness has been attained. With this transient heat procedure, time reduction in Pt-metallizing is substantial (from 2-3 hours to 30 minutes) and the metal deposit may attain a greater thickness that may not be attainable without it.

Independently from all the above advantages of the present invention, which will be obvious from the following examples, the list of added species to the polymeric base, which are necessary for metallization of a composite is not limited. It may be accomplished without changing the process.

Figure 21:
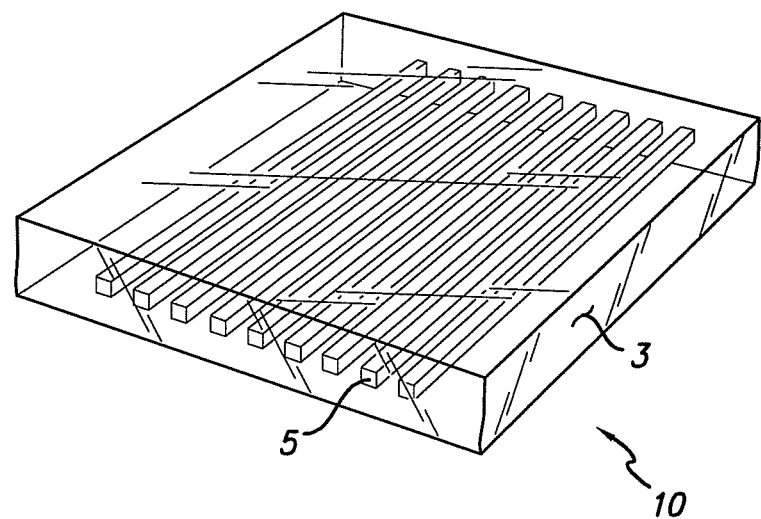
FIG. 21 depicts a perspective view of a polymer layer with one embedded series of metal traces as shown in FIG. 8.
Figure 22:
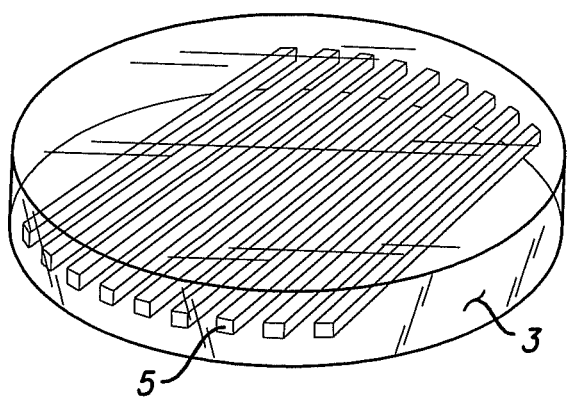
FIG. 22 depicts a perspective view of a polymer layer with one embedded series of metal traces as shown in FIG. 8 after a cut out of the polymer.
Figure 23:
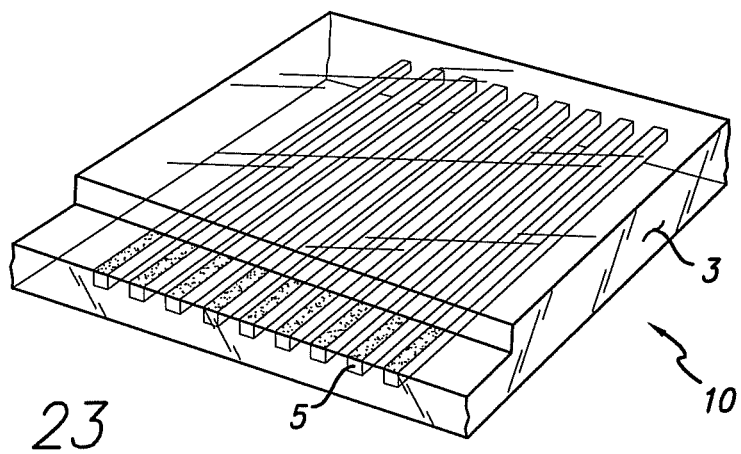
FIG. 23 depicts a cross-sectional view of a polymer layer with one embedded series of metal traces after opening the traces.
Figure 24:
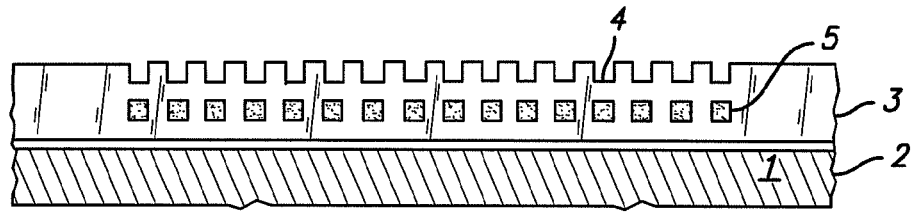
FIG. 24 depicts a cross-sectional view of the polymer layer after laser treatment of the second polymer layer.
Figure 25:
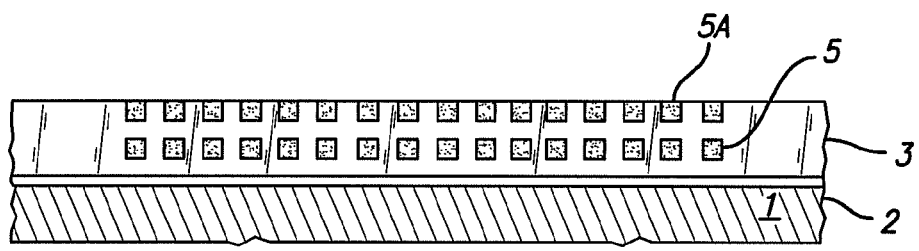
FIG. 25 depicts a cross-sectional view of the polymer layer after metallization of the second polymer layer.
Figure 26:
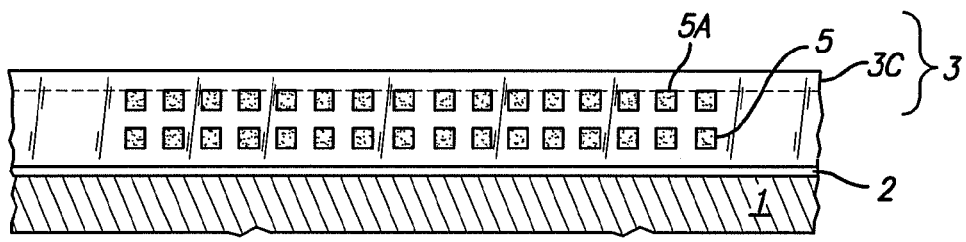
FIG. 26 depicts a cross-sectional view of the polymer layer after applying a third polymer layer and after curing.
Figure 27:
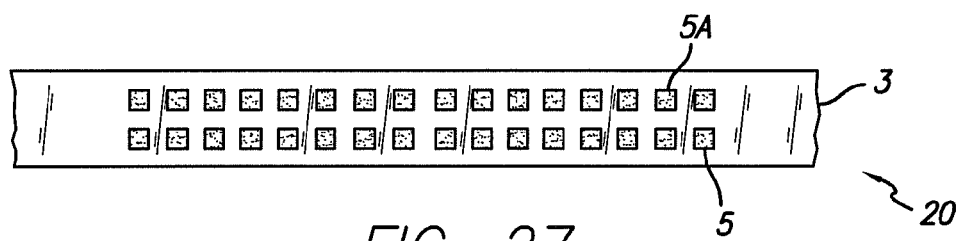
FIG. 27 depicts a cross-sectional view of a polymer layer with two embedded overlapping crossing series of metal traces after removing the layer from the rigid substrate.

FIGS. 21 to 23 show a polymer layer, preferably a silicone layer 3, containing metal traces 5, preferably platinum, which are embedded in the polymer 3. FIG. 21 shows the polymer layer 3 after being removed from the substrate 1. FIG. 22 shows the polymer layer 3 shaped as a circle. FIG. 23 shows the polymer layer 3 after adding openings to the metal traces 5.

Figure 28:
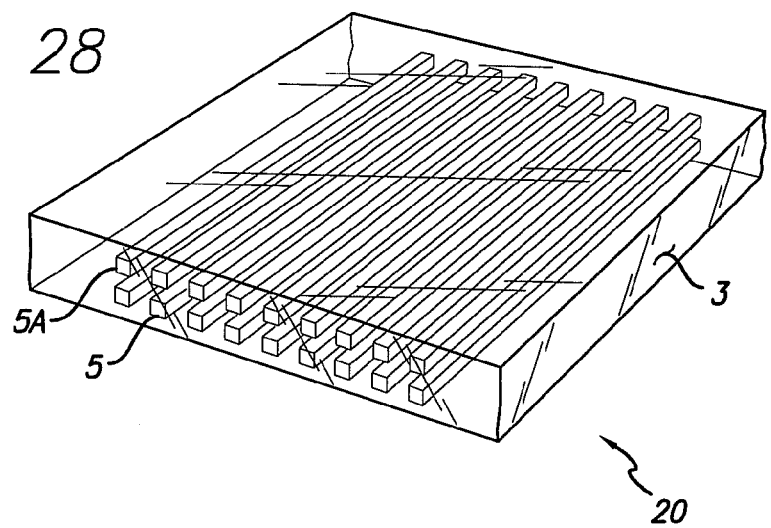
FIG. 28 depicts a perspective view of a polymer layer with two embedded overlapping series of metal traces as shown in FIG. 27.
Figure 29:
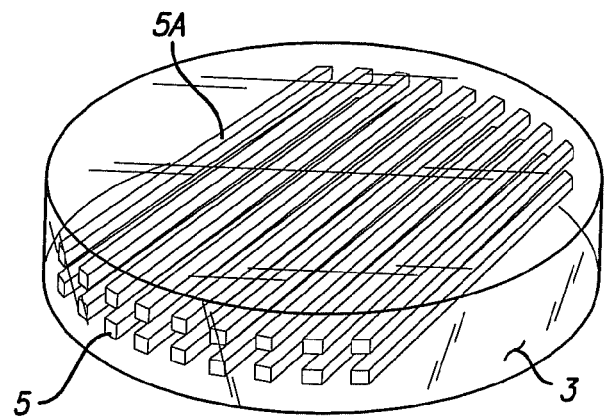
FIG. 29 depicts a perspective view of a polymer layer with one embedded series of metal traces as shown in FIG. 28 after a cut out of the polymer.
Figure 30:
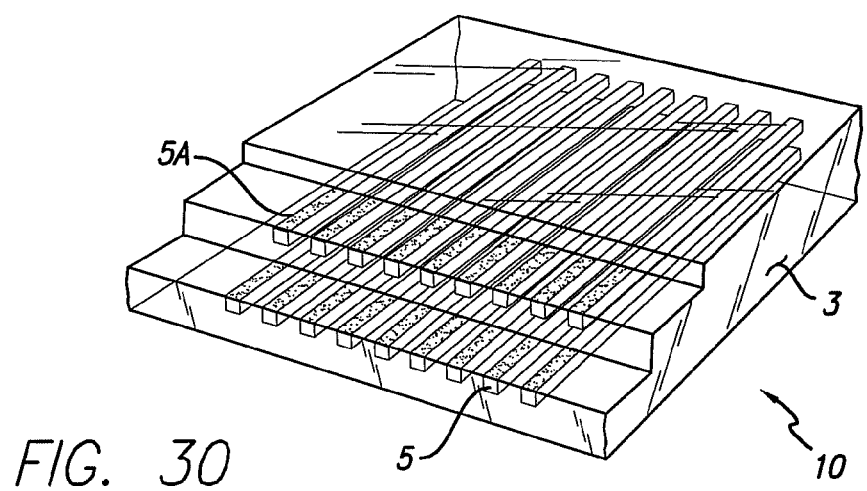
FIG. 30 depicts a cross-sectional view of a polymer layer with two embedded series of metal traces as shown in FIG. 28 after opening the traces.
Figure 31:
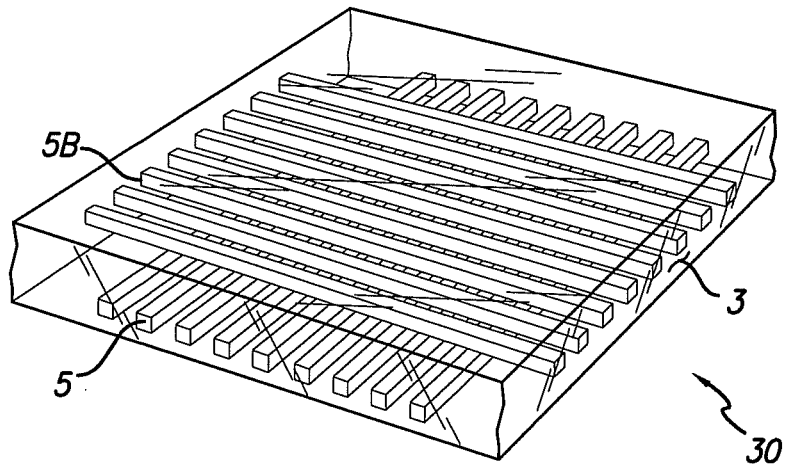
FIG. 31 depicts a perspective view of a polymer layer with two embedded overlapping crossing series of metal traces.
Figure 32:
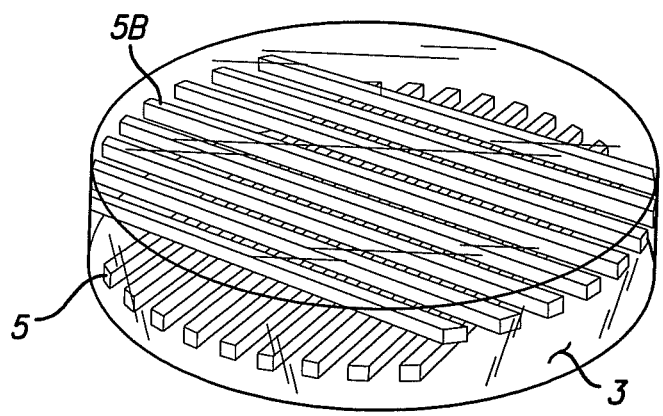
FIG. 32 depicts a perspective view of a polymer layer with two embedded series of metal traces as shown in FIG. 31 after a cut out of the polymer.
Figure 33:
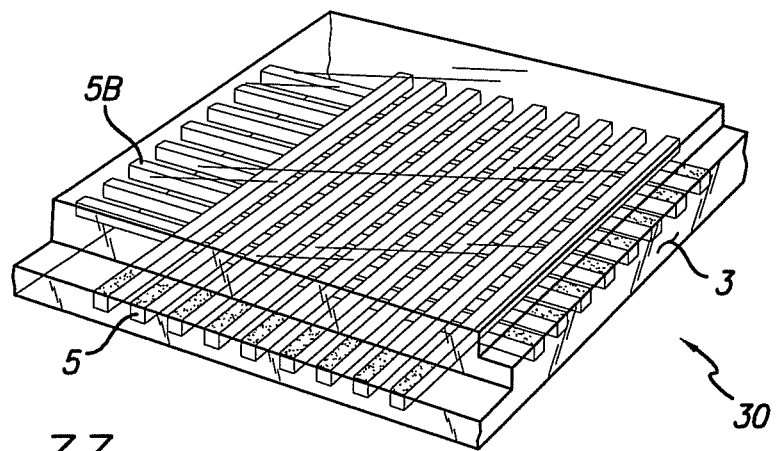
FIG. 33 depicts a cross-sectional view of a polymer layer with two embedded series of metal traces as shown in FIG. 31 after opening the traces.

FIGS. 28 to 30 and FIGS. 31 to 33 show, similar to FIGS. 21 to 23, a polymer layer lifting off a substrate (FIGS. 28 and 31), shaped as a circle (FIGS. 29 and 32), and after adding openings to the traces (FIGS. 30 and 33). FIGS. 28 to 30 show two layers of parallel metal traces 5 and 5A stacked parallel to each other in the polymer layer 3. FIGS. 31 to 33 show perpendicular metal traces 5 and 5B stacked perpendicular to each other in the polymer layer 5.

FIGS. 34A to 34G show the sequence for producing an interconnection between traces crossing each other like traces of platinum 5 and 5B.

Figure 34A:
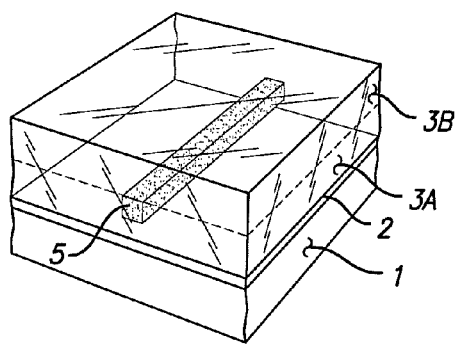
FIG. 34A depicts a perspective view of a first polymer layer with one embedded metal trace.

FIG. 34A depicts a perspective view of a polymer layer 3A) and 3B layer with one embedded metal trace 5 in polymer layer 3A.

Figure 34B:
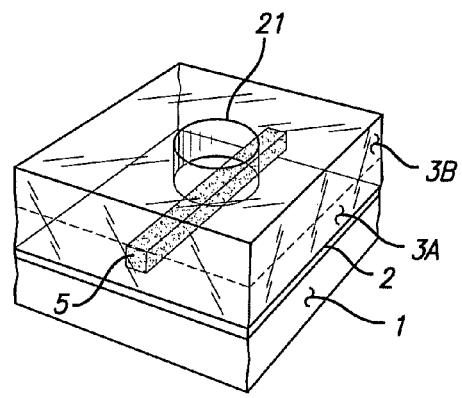
FIG. 34B depicts a perspective view of a first polymer layer after laser drilling through the upper front of the layer to form an opening down to the metal trace.

FIG. 34B depicts a perspective view of a first silicon layer (3A and 3B) after laser drilling through the second silicon layer 3B to form an opening 21 to the metal trace 5.

Figure 34C:
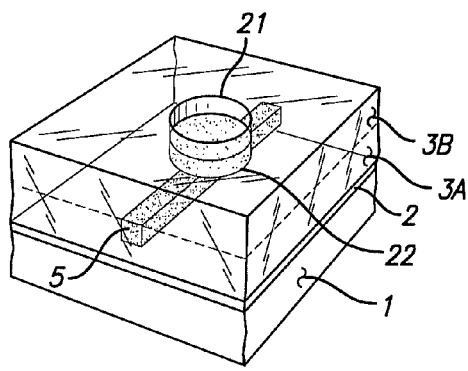
FIG. 34C depicts a perspective view of a first polymer layer after partial metal plating of the laser cut opening.

FIG. 34C depicts a perspective view of a first silicon layer 3A and a second silicon layer 3B after partial metal plating 22 of the laser cut opening 21.

Figure 34D:
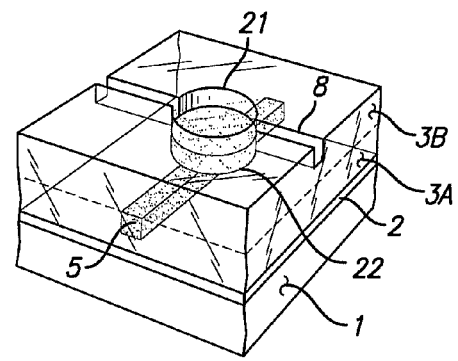
FIG. 34D depicts a perspective view of a first polymer layer after laser processing the traces to overlap the opening.

FIG. 34D depicts a perspective view of a polymer layer after laser processing traces 8 into the second silicone layer 3B to overlap opening 21.

Figure 34E:
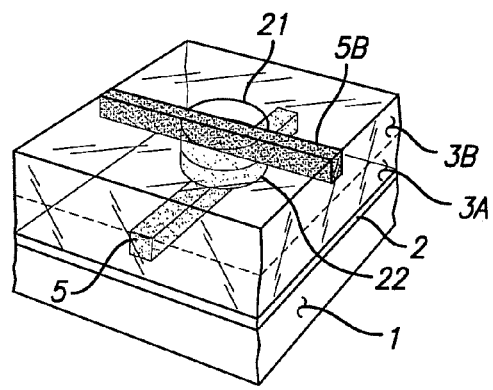
FIG. 34E depicts a perspective view of a first polymer layer after metallizing of the trace and further metallizing the opening.

FIG. 34E depicts a perspective view of a polymer layer after metallizing 5B of the trace 8 and further metallizing 22 the opening 21.

Figure 34F:
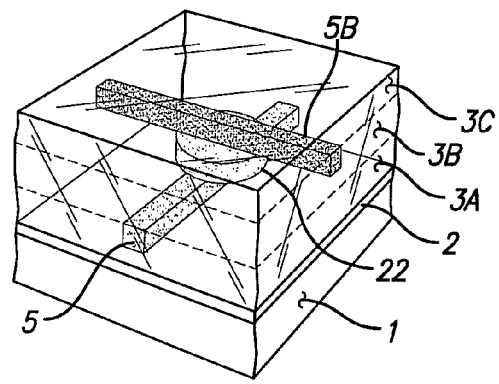
FIG. 34F depicts a perspective view of a first polymer layer after disposing a second polymer layer on top of it and form a bi-layer.

FIG. 34F depicts a perspective view of a the polymer layer after disposing a second polymer layer 3C on top of it, forming a bi-layer.

Figure 34G:
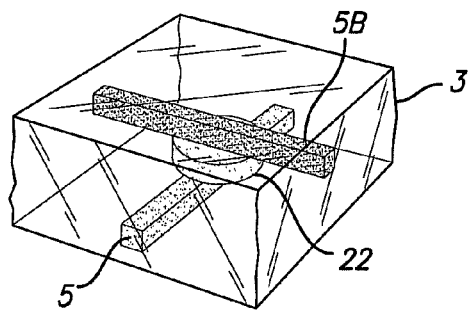
FIG. 34G depicts a perspective view of a polymer layer after removing the layer from the rigid substrate.

FIG. 34G depicts a perspective view of a polymer layer (3A-3C) after removing the polymer layer from the rigid substrate 1.

The platinum metallization of silicone is explained in Example 1 and Example 2.

EXAMPLE 1

1. Protective Coating with PMMA

A silicone sheet (NuSil MED 4950 from NUSIL TECHNOLOGY LLC, Carpinteria, Calif.) having a thickness of 80 µm was spray-coated with a 2 µm thick PMMA layer. The silicone sheet was immersed for five minutes in an ultrasonic bath at 40° C., containing a low acidity 1.5% HCl solution. The silicone sheet was rinsed two times with distilled water.

2. First Metallization

The silicone sheet was Pt-metallized for 6 hours in two successive platinum-containing baths.

The silicone sheet was immersed in 100 ml plating solution containing 0.6 g of potassium (II) tetra-nitro-platinate, 20 ml of ammonium hydroxide 28%, and 0.2 g of complexing agent. The silicone sheet was then rinsed with distilled water.

3. Removal of PMMA Protective Coating:

The silicone sheet was immersed in two successive and fresh ultrasonic baths for five minutes each containing $CHCl_3$ that dissolved the PMMA protection layer. The silicone sheet was rinsed two times for 5 to 10 minutes in ultrasonic distilled water bath and dried.

4. Final Metallization

Silicone sheet was mounted on a glass cylinder. The glass with the silicone sheet was immersed in the same metallizing solution in a temperature controlled vessel for 3 to 5 hours. From time to time (e.g., every 10 minutes), hydrogen bubbles were eliminated from sheeting by vibrating the cylinder or by heat flashing the silicone sheet. The silicone sheet was rinsed in distilled water at the end of the procedure.

PMMA coating allowed removal of irradiation residues that were generated during irradiation and which could sediment on the irradiated areas. It was operated at constant pressure of the PMMA suspension, scanning the sheeting at fixed distance and constant speed, and in a clean environment (either in a grey room or in a glove box under an argon atmosphere).

Step-two glass cylinder and the temperature controlled vessel were specifically designed for this purpose. The invention metallizes an expanded silicone layer for enhanced metal embedding. A silicone was applied on a glass cylinder. After inscribing the laser-processed traces on the convex, expanded silicone surface, the silicone layer on the glass cylinder was placed in an electroless Pt bath for metallization of the traces. The metallized silicone layer was detached from the glass cylinder and it recovered its original planar geometry. The expanded Pt-traces contracted, thereby enclosing the metal parts in silicone, providing an enhanced integration of these traces in the silicone layer. The expanded Pt-traces contracted and enclose the metal parts in the silicone, thereby providing enhanced integration of the traces into the silicone layer.

EXAMPLE 2

1. Protective Coating with PMMA

A silicone sheet (NuSil MED 4950 from NUSIL TECHNOLOGY LLC, Carpinteria, Calif.) having a thickness of 80 μm was spray-coated with a 2 μm thick PMMA layer. The silicone sheet was immersed for five minutes in an ultrasonic bath at 40° C. containing a low acidity 1.5% HCl solution. The silicone sheet was rinsed twice with distilled water.

2. First Metallization

The silicone sheet was Pt-metallized for 6 hours in two successive platinization baths.

The silicone sheet was immersed in 100 ml of plating solution containing 0.6 g of potassium (II) tetra-nitro-platinate, 20 ml of ammonium hydroxide 28%, and 0.2 g of complexing agent. The silicone sheet was then rinsed with distilled water.

3. Removal of PMMA Protective Coating:

The silicone sheet was immersed in two successive ultrasonic baths for five minutes each containing $CHCl_3$ that dissolved the PMMA protection layer. The silicone sheet was rinsed two times for 5 to 10 minutes in an ultrasonic distilled water bath and dried.

4. Final Metallization

Silicone sheet was mounted on a glass cylinder. The glass with the silicone sheet was immersed in the same metallizing solution being in a temperature controlled vessel for 3 to 5 hours. Periodically (e.g., every 10 minutes) hydrogen bubbles were eliminated from the sheeting by vibrating the cylinder or by heat flashing the silicone sheet. The silicone sheet was rinsed in distilled water at the end of the procedure.

PMMA coating allowed removal of irradiation residues that were generated during irradiation and could settle laterally to the irradiated areas. It was operated at constant pressure of the PMMA suspension, scanning the sheeting at fixed distance and constant speed in a clean environment (either a grey room or a glove box under an argon atmosphere).

Step-two glass cylinder and temperature controlled vessel both were specifically designed for this purpose. The present invention provided metallizing of an expanded silicone layer for enhanced metal imbedding. A silicone was applied on a glass cylinder. After inscribing the laser-processed traces on the convex, expanded silicone surface, the silicone layer on the glass cylinder was brought in an electroless Pt bath for metallization of the traces. The metallized silicone layer was detached from the glass cylinder and it recovered its original planar geometry. The expanded Pt-traces contracted, enclosing the metal parts into silicone and provided integration of the traces into the silicone layer. The expanded Pt-traces contracted and enclosed the metal parts in the silicone, thereby providing integration of the traces with the silicone layer.

While the invention has been described by means of specific embodiments and applications thereof, it is understood that modifications and variations could be made thereto by those skilled in the art without departing from the spirit and scope of the invention. It is therefore to be understood that within the scope of the claims, the invention may be practiced otherwise than as specifically described herein.

What we claim is:

1. A method of embedding at least one layer of at least one metal trace in a silicone containing polymer, comprising the steps of:

providing a substrate;

applying an anti-adherent agent that adheres to said substrate;

applying a first silicone containing polymer layer having a surface area on said anti-adherent agent, where said agent adheres less to said first silicone containing polymer layer than said substrate;

first irradiating said surface area of said first silicone containing polymer layer with a first ultraviolet light beam emitted by an excimer laser at a wavelength below 200 nm to ablate said surface area;

creating cuts, grooves, blind holes or vias, having a second surface area formed by said first irradiating below 200 nm with said first ultraviolet light beam;

second irradiating said second surface area of said first silicone containing polymer layer with a second ultraviolet light beam emitted by an excimer laser at a wavelength between 308 and 350 nm;

creating an irradiated surface by said second irradiating between 308 and 350 nm;

immersing said irradiated surface of said first silicone containing polymer layer in an autocatalytic bath containing metal ions of at least one metal and metallizing said irradiated surface area of said first silicone containing polymer layer on said second surface forming metal traces embedded in said first silicone containing polymer layer;

thermally treating said metallized first silicone containing polymer layer to induce diffusion of metal from the metallizing into said first silicone containing polymer layer;

applying a second silicone containing polymer layer on said thermally treated metallized first silicone containing polymer layer forming a first bi-layer silicone containing polymer layer;

thermally treating said first bi-layer silicone containing polymer layer; and removing said first bi-layer silicone containing polymer layer from said anti-adherent agent on said substrate.

2. The method according to claim 1, further comprising the step of irradiating said surface area of said first silicone containing polymer layer with an ultraviolet light beam having an axis and an intensity that is homogenized by passing said second ultraviolet light beam between 308 and 350 nm through a homogenizing optical system which homogenizes said intensity of said second ultraviolet light beam.

3. The method according to claim 2, further comprising the step of irradiating said surface area of said first silicone containing polymer layer with said second homogenized ultraviolet light beam between 308 and 350 nm that passes through at least one square, rectangular or circular planar mask, disposing said planar mask in a plane perpendicular to said axis of said homogenized ultraviolet light beam, said planar mask being interposed in said homogenized ultraviolet light beam.

4. The method according to claim 1, further comprising a step of immersing said irradiated first silicone containing polymer layer in said autocatalytic bath containing metal ions of at least one metal and metallizing said first silicone containing polymer layer and immersing said metallized first silicone containing polymer layer in said autocatalytic bath containing metal ions, and wherein two or more metal films, each having a thickness, containing said metal ions are separately deposited on said surface area of said first silicone containing polymer layer, and wherein said two or more metal films partially overlap on said surface area.

5. The method according to claim 4, wherein said step of immersing said irradiated first silicone containing polymer layer in a second autocatalytic bath containing second metal ions of at least one metal and metallizing said first silicone containing polymer layer is carrying said first polymer layer by a moving carrier and is delivering said first silicone containing polymer layer to said second autocatalytic bath and is immersing said first silicone containing polymer layer by said moving carrier in said second autocatalytic bath.

6. The method according to claim 4, wherein said step of thermally treating said metallized first silicone containing polymer layer step is placing said metallized first polymer layer in a microwave oven and thermally treating said metallized first silicone containing polymer layer.

7. The method according to claim 4, further comprising the step of immersing said metallized first silicone containing polymer layer into said second autocatalytic bath containing said second metal ions and forming a second bi-layer silicone containing polymer layer which is metallized with two overlapping and different metal films.

8. The method according to claim 1, further comprising the step of applying magnesium fluoride as said anti-adherent agent.

\* \* \* \* \*